(12) United States Patent
Dziobkowski et al.

(10) Patent No.: US 7,910,484 B2
(45) Date of Patent: Mar. 22, 2011

(54) METHOD FOR PREVENTING BACKSIDE DEFECTS IN DIELECTRIC LAYERS FORMED ON SEMICONDUCTOR SUBSTRATES

(75) Inventors: Chester T. Dziobkowski, Hopewell Junction, NY (US); Thomas F. Houghton, Marlboro, NY (US); Emily Kinser, Poughkeepsie, NY (US); Darryl D. Restaino, Modena, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 11/972,895

(22) Filed: Jan. 11, 2008

(65) Prior Publication Data
US 2009/0181544 A1 Jul. 16, 2009

(51) Int. Cl.
*H01L 21/302* (2006.01)
*H01L 21/461* (2006.01)
*H01L 21/311* (2006.01)

(52) U.S. Cl. .................. 438/694; 438/710; 438/745
(58) Field of Classification Search .......... 216/67, 216/13, 83; 438/710, 638, 639; 427/249.1
See application file for complete search history.

(56) References Cited

U.S. PATENT DOCUMENTS

| | | | |
|---|---|---|---|
| 5,425,846 A | 6/1995 | Koze et al. | |
| 5,723,385 A | 3/1998 | Shen et al. | |
| 5,824,457 A | 10/1998 | Liu et al. | |
| 5,929,509 A | 7/1999 | Shen et al. | |
| 6,153,537 A * | 11/2000 | Bacchetta et al. | 438/763 |
| 6,599,839 B1 | 7/2003 | Gabriel et al. | |
| 6,660,643 B1 | 12/2003 | Kardauskas et al. | |

* cited by examiner

*Primary Examiner* — Roberts Culbert
(74) *Attorney, Agent, or Firm* — Schmeiser, Olsen & Watts; Daniel Schnurmann

(57) ABSTRACT

A method of forming a TEOS oxide layer over an nitrogen doped silicon carbide or nitrogen doped hydrogenated silicon carbide layer formed on a substrate. The method includes forming the nitrogen doped silicon carbide or nitrogen doped hydrogenated silicon carbide layer on a top surface and a top side beveled edge proximate to the top surface of a substrate; removing or preventing formation of a carbon-rich layer on a bottom side bevel edge region proximate to a bottom surface of the substrate or converting the carbon-rich layer to nitrogen doped silicon carbide or nitrogen doped hydrogenated silicon carbide; and forming the TEOS oxide layer on the top surface, the top side beveled edge and the bottom side bevel edge region of the substrate.

12 Claims, 4 Drawing Sheets

US 7,910,484 B2

METHOD FOR PREVENTING BACKSIDE DEFECTS IN DIELECTRIC LAYERS FORMED ON SEMICONDUCTOR SUBSTRATES

FIELD OF THE INVENTION

The present invention relates to the field of deposition of dielectric layers; more specifically, it relates to a method for preventing backside peeling defects in dielectric layers formed on semiconductor substrates and an apparatus for depositing dielectric layers on a semiconductor substrate.

BACKGROUND OF THE INVENTION

When multiple dielectric layers are deposited one on top of each other it is important that good adhesion exist between an upper layer and a lower layer. Anything that adversely affects this adhesion can lead to foreign material generation that ultimately can reduce yield. Therefore, the industry welcomes the discovery of the cause and methods for prevention of inter-layer dielectric adhesion problems.

SUMMARY OF THE INVENTION

A first aspect of the present invention is a method, comprising: (a) providing a circular substrate having parallel top surface and bottom surfaces, an edge, a top beveled surface between the top surface and the edge and a bottom-beveled surface between the bottom surface and the edge; after (a), (b) simultaneously forming using a first plasma enhanced chemical vapor deposition process (i) a first dielectric layer of nitrogen doped silicon carbide or nitrogen doped hydrogenated silicon carbide on the top surface, the top beveled surface, and the edge of the substrate and (ii) a carbon-rich layer on the bottom beveled surface that includes a material that is not nitrogen doped silicon carbide or nitrogen doped hydrogenated silicon carbide, the material derived from a precursor used to form the first dielectric layer; after (b), (c) treating the carbon-rich layer; and after (c), (d) forming a second dielectric layer of tetraethoxysilane silicon oxide or fluorinated tetraethoxysilane silicon oxide using a second plasma enhanced chemical vapor deposition process on the first dielectric layer.

A second aspect of the present invention is a method, comprising: (a) providing a circular substrate having parallel top surface and bottom surfaces, an edge, a top beveled surface between the top surface and the edge and a bottom-beveled surface between the bottom surface and the edge; after (a), (b) in a first plasma chamber simultaneously forming using a first plasma enhanced chemical vapor deposition process (i) a first dielectric layer of nitrogen doped silicon carbide or nitrogen doped hydrogenated silicon carbide on the top surface, the top beveled surface, and the edge of the substrate and (ii) a carbon-rich layer on the bottom beveled surface that includes a material that is not nitrogen doped silicon carbide or nitrogen doped hydrogenated silicon carbide; after (b), (c) treating the carbon-rich layer, the material derived from a precursor used to form the first dielectric layer; and (d) in a second chamber, forming a second dielectric layer of tetraethoxysilane silicon oxide or fluorinated tetraethoxysilane silicon oxide using a second plasma enhanced chemical vapor deposition process on the first dielectric layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Integrated circuit chips are fabricated using thin and circular (or disc-shaped) substrates called wafers. Many integrated circuits chips are fabricated on the same substrate and then the wafer is diced into individual chips.

Figure 1:
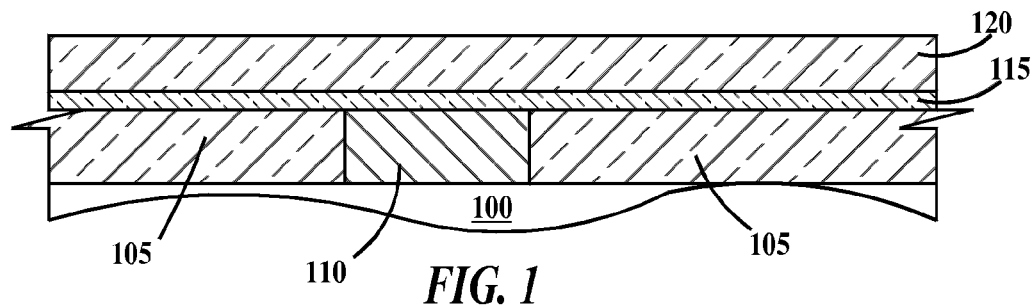
FIG. 1 is a cross-section through an exemplary integrated circuit chip illustrating a fabrication step utilizing the dielectric materials of interest in the present invention.

FIG. 1 is a cross-section through an exemplary integrated circuit chip illustrating a fabrication step utilizing the dielectric materials of interest in the present invention. In FIG. 1, formed on a semiconductor substrate 100 is a dielectric layer 105. Formed in dielectric layer 105 is an electrically conductive wire 110. Top surfaces of dielectric layer 105 and wire 110 are coplanar. Formed on the top surfaces of dielectric layer 105 and wire 110 is a dual-layer dielectric comprising a first dielectric layer 115 and a second dielectric layer 120. First dielectric layer 115 is formed on the top surfaces of dielectric layer 105 and wire 110. Second dielectric layer 120 is formed on a top surface of first dielectric layer 115. Wire 110 comprises copper, first dielectric layer consists of nitrogen doped silicon carbide or nitrogen doped hydrogenated silicon carbide and second dielectric layer 120 consists of TEOS oxide. The chemical composition and methods of forming nitrogen doped silicon carbide or nitrogen doped hydrogenated silicon carbide and TEOS oxide are discussed infra. First dielectric layer 115 acts a diffusion barrier to copper. In one example substrate 100 comprises silicon.

Figure 2A:
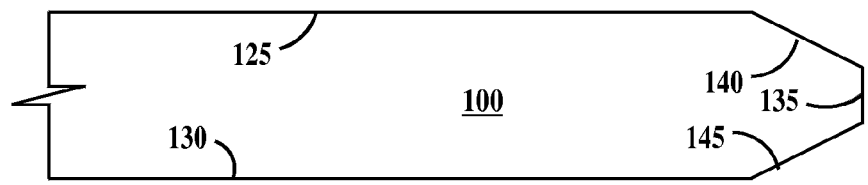
FIGS. 2A through 2C are cross-section through a semiconductor substrate showing deposition of a dual-layer dielectric illustrating the problem solved by the present invention.
Figure 2B:
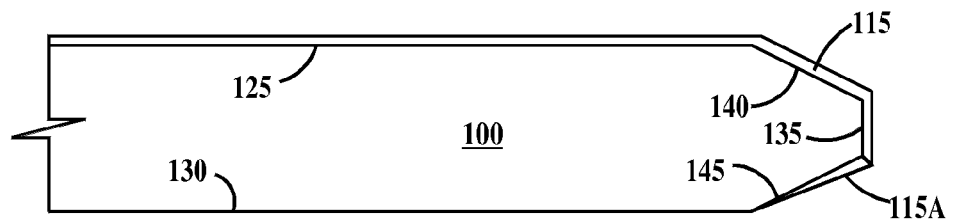
Figure 2C:
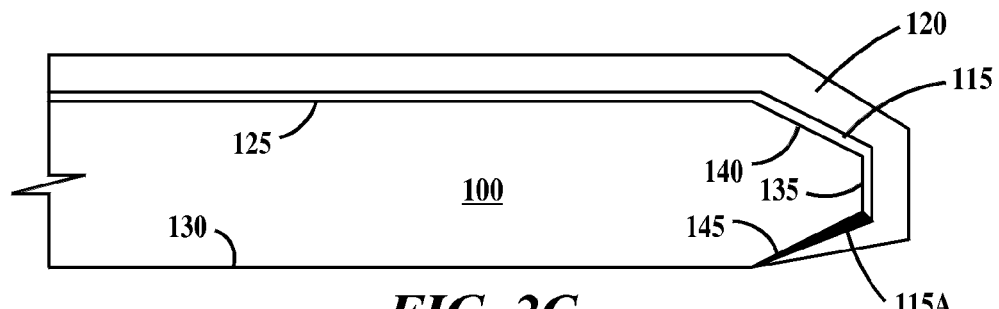

FIGS. 2A through 2C are cross-section through a semiconductor substrate showing deposition of a dual-layer dielectric illustrating the problem solved by the present invention. In FIG. 2A substrate 100 is seen to have a top surface 125, a bottom surface 130 and an edge 135. The corner formed by edge 135 and top surface 125 has been ground (or otherwise removed) to form a top beveled surface 140 between top surface 125 and edge 135. Likewise, the corner formed by edge 135 and bottom surface 130 has been ground (or otherwise removed) to form a bottom beveled surface 145 between bottom surface 130 and edge 135. The integrated circuit chip components such as transistors and wire 100 of FIG. 1 are formed in substrate 125 proximate to top surface 125 or over top surface 125.

In FIG. 2B, a nitrogen doped silicon carbide or nitrogen doped hydrogenated silicon carbide layer 115 (the same as first dielectric layer 115 of FIG. 1) is shown. Nitrogen doped silicon carbide is a compound of silicon, carbon and nitrogen. Nitrogen doped hydrogenated silicon carbide is a compound of silicon, carbon, nitrogen and hydrogen. An example chemical formulas for nitrogen doped silicon carbide is SiCN. An example chemical formula for nitrogen doped hydrogenated silicon carbide is SiC(N,H). Nitrogen doped silicon carbide or nitrogen doped hydrogenated silicon carbide is also called NBloK™ Applied Materials, Santa Clara, Calif. Nitrogen doped silicon carbide or nitrogen doped hydrogenated silicon carbide is formed in a plasma-enhanced chemical vapor deposition (PECVD) process.

PECVD is a species of chemical vapor deposition (CVD) techniques for depositing a desired material on a substrate using vapor phase chemical precursors. Generally, CVD techniques are conducted by supplying chemical precursors and allowing them to react with one another and the surface of the substrate to form a layer on the substrate. The chemical precursors are activated by subjecting the chemical precursor to an amount of energy that is effective to decompose the precursor by breaking one or more chemical bonds. In PECVD, an electromagnetic field is applied to vapor phase chemical precursors to turn them to highly reactive species in a plasma phase. These activated species react with one another to deposit a desired compositional material on the substrate.

The precursor gases supply silicon, carbon, nitrogen and hydrogen. There are very many precursor gas mixtures. In some, two or more of the silicon, carbon, nitrogen and hydrogen are supplied in a same case. Examples of precursor gases include, but are not limited to $N_2$, $SiH_4$, $Si_2H_6$, $Si_3H_8$, $SiF_4$, $SiCl_4$, $HSiCl_3$, $HSiH(CH_3)_3$, $HSiBr_3$, $CH_4$, $C_2H_4$, $C_3H_6$, $C_4H_{10}$, $C_2H_4$, $NF_3$, $NCl_3$, $NH_3$, $F_2NNF_2$ and FNNF.

Figure 9:
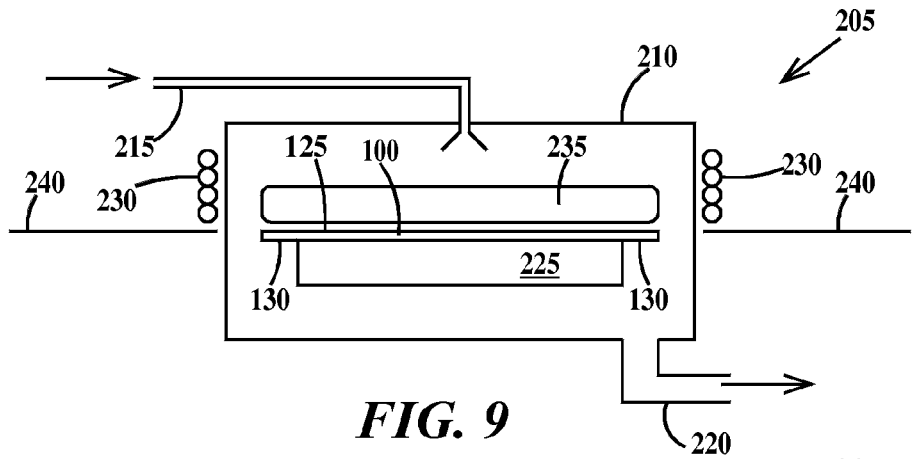
FIG. 9 is a schematic diagram of a conventional deposition tool.

Also in FIG. 2B, a carbon-rich layer 115A is formed on bottom bevel 145 where there is little to no plasma energy due to the design of the plasma chamber (see FIG. 9 for an example). Carbon-rich region 115A may comprise (1) precursor, (2) not fully reacted precursor, (3) nitrogen doped silicon carbide or nitrogen doped hydrogenated silicon carbide mixed with precursor or with not fully reacted precursor or (4) precursor or not fully reacted precursor over nitrogen doped silicon carbide or nitrogen doped hydrogenated silicon carbide to give a few examples. The inventors have discovered that the layer labeled 115A is a organic carbon-rich region that includes a material that is not nitrogen doped silicon carbide or nitrogen doped hydrogenated silicon carbide but is or is derived from unreacted nitrogen doped silicon carbide or nitrogen doped hydrogenated silicon carbide precursor.

In FIG. 2C, second dielectric layer 120 (TEOS oxide) is formed by PECVD of precursor tetraethoxysilane (TEOS) on top of first dielectric layer 115 and carbon-rich-region 150A. If a fluorine-containing precursor is included, then a fluorinated TEOS (FTEOS) oxide is formed. TEOS oxide is essentially silicon oxide ($SiO_2$), the term TEOS oxide indicating the process used to form the oxide to distinguish this particular silicon oxide from silicon oxides formed by other processes. The nitrogen doped silicon carbide or nitrogen doped hydrogenated silicon carbide and TEOS oxide PECVDs are performed in separate chambers/tools, so between FIGS. 2C and 2D, substrate 100 is transferred from a first chamber/tool to a second chamber/tool.

While TEOS oxide adheres well to nitrogen doped silicon carbide or nitrogen doped hydrogenated silicon carbide layer 115 and substrate 100, it has been discovered by the inventors that TEOS oxide does not adhere well to carbon-rich region 115A and flakes of TEOS oxide break or peel off and cause foreign defects in and on regions of TEOS layer 120 over top surface 125.

Figure 3A:
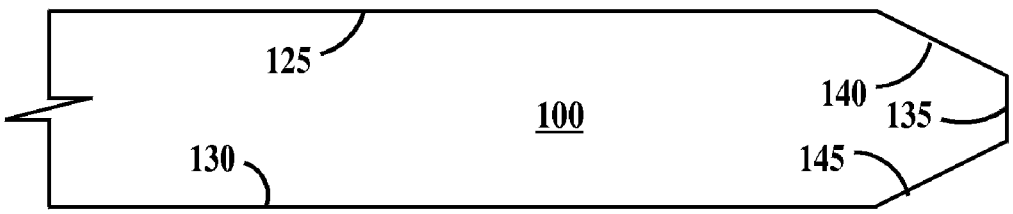
FIGS. 3A through 3D are cross-section through a semiconductor substrate showing deposition of a dual-layer dielectric according to a first embodiment of the present invention.
Figure 3B:
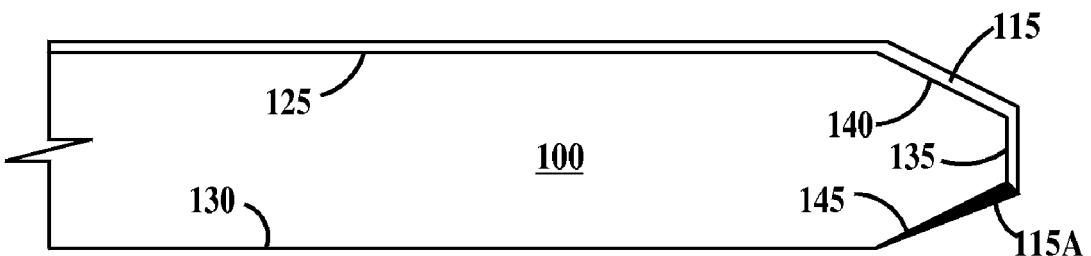

FIGS. 3A through 3D are cross-section through a semiconductor substrate showing deposition of a dual-layer dielectric according to embodiments of the present invention. FIGS. 3A and 3B are identical to respective FIGS. 2A and 2B.

Figure 3C:
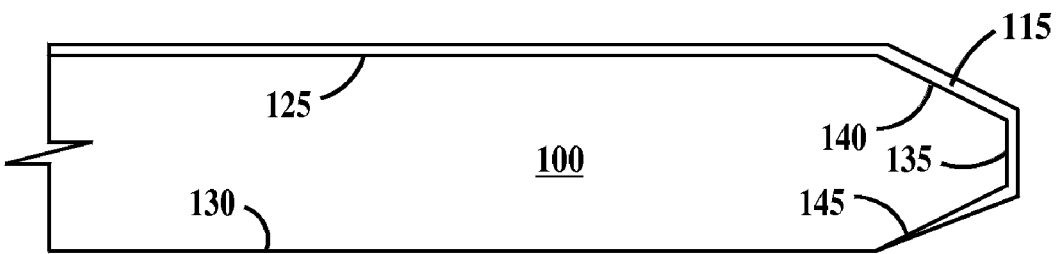
Figures 5, 6, 7, 8:
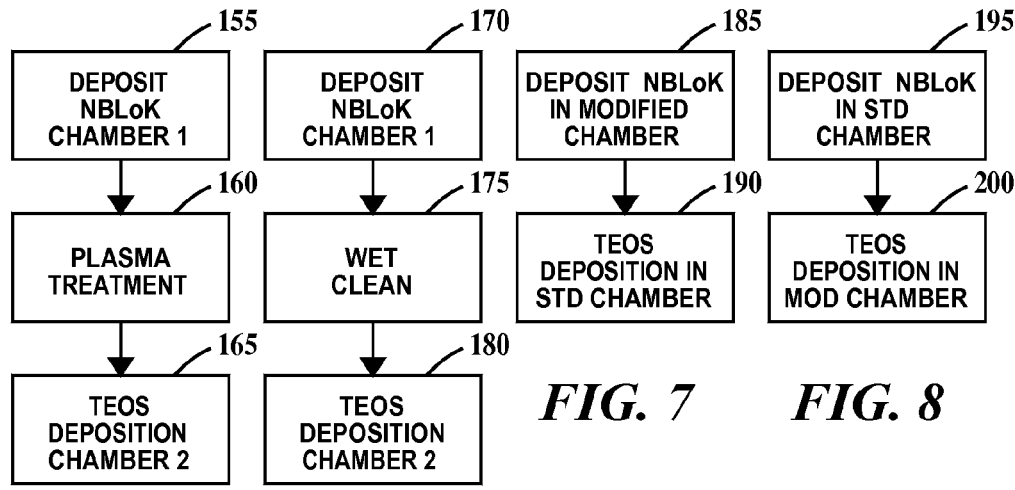
FIG. 5 is a flowchart of a first method of depositing a dual-layer dielectric according to embodiments of the present invention.
FIG. 6 is a flowchart of a second method of depositing a dual-layer dielectric according to embodiments of the present invention.
FIG. 7 is a flowchart of a third method of depositing a dual-layer dielectric according to embodiments of the present invention.
FIG. 8 is a flowchart of a fourth method of depositing a dual-layer dielectric according to embodiments of the present invention.

In FIG. 3C, carbon-rich region 115A of FIG. 3B is converted to nitrogen doped silicon carbide or nitrogen doped hydrogenated silicon carbide 115 as described infra in reference to FIG. 5, by treatment with an ammonia containing plasma.

Figure 3D:
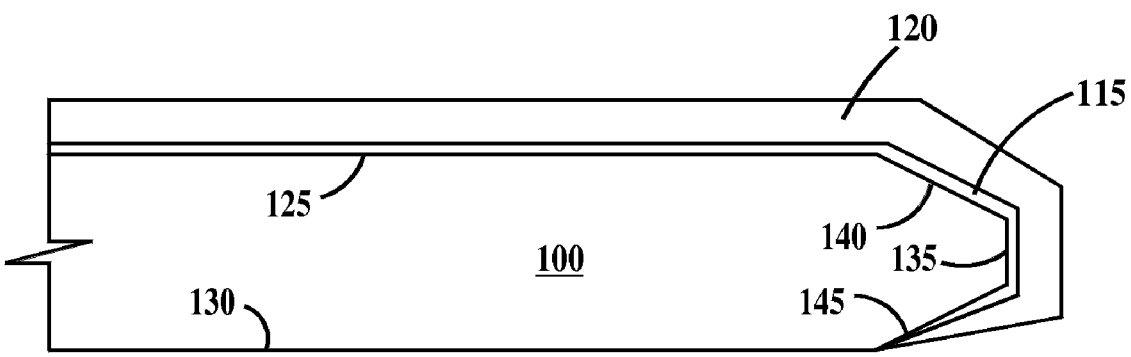

In FIG. 3D, TEOS oxide (layer 120) is deposited as described supra in reference to FIG. 2C.

Figure 4A:
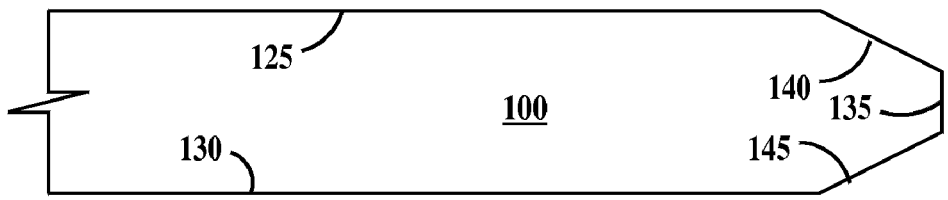
FIGS. 4A through 4D are cross-section through a semiconductor substrate showing deposition of a dual-layer dielectric according to a second embodiment of the present invention.
Figure 4B:
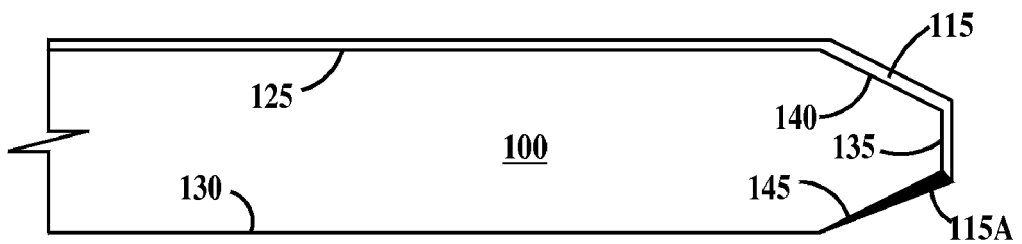

FIGS. 4A through 4D are cross-section through a semiconductor substrate showing deposition of a dual-layer dielectric according to a second embodiment of the present invention. FIGS. 4A and 4B are identical to respective FIGS. 2A and 2B.

Figure 4C:
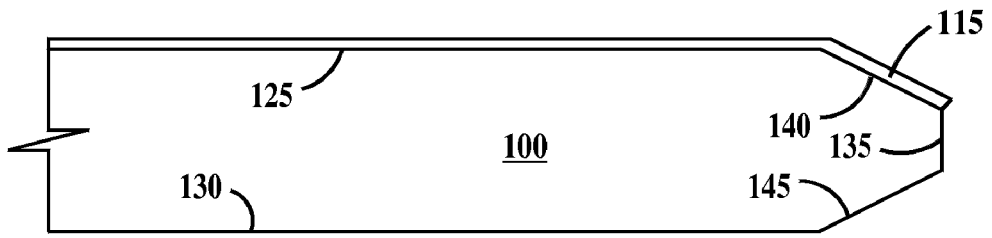

In FIG. 4C, carbon-rich region 115A (see FIG. 4B) is removed as described infra in reference to FIGS. 5 and 6 by plasma treatment in an oxygen based plasma or by wet etching. In the example of FIG. 4C, silicon carbide or nitrogen doped hydrogenated silicon carbide 115 layer is removed from edge 135 of substrate 100.

Figure 4D:
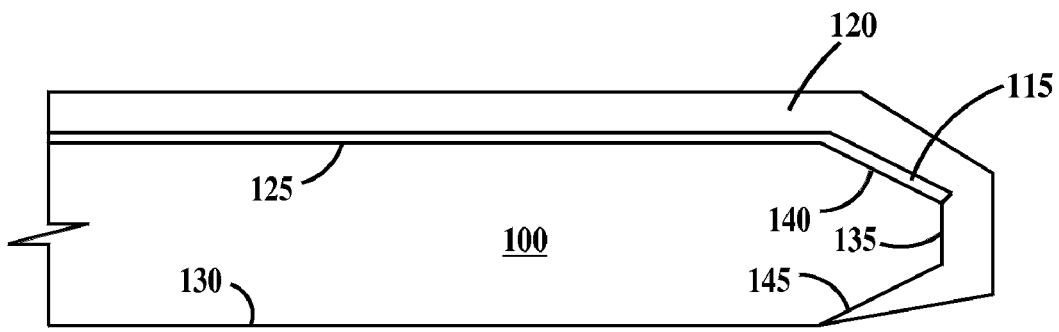

In FIG. 4D, TEOS oxide (layer 120) is deposited as described supra in reference to FIG. 2D.

FIG. 5 is a flowchart of a first method of depositing a dual-layer dielectric according to embodiments of the present invention. In step 155, nitrogen doped silicon carbide or nitrogen doped hydrogenated silicon carbide is deposited on a substrate in a first PECVD chamber (see FIGS. 3B and 4B). In step 160, the substrate is removed from the first PECVD chamber and placed in a plasma treatment chamber where carbon-rich layer 115A, is converted to nitrogen doped silicon carbide or nitrogen doped hydrogenated silicon carbide 115 (see FIG. 3C) using an ammonia based plasma or is removed using an oxygen based plasma (see FIG. 4C). In step 165, TEOS (or FTEOS) is deposited on the nitrogen doped silicon carbide or nitrogen doped hydrogenated silicon carbide layer in a second PECVD chamber.

FIG. 6 is a flowchart of a second method of depositing a dual-layer dielectric according to embodiments of the present invention. In step 170, nitrogen doped silicon carbide or nitrogen doped hydrogenated silicon carbide is deposited on a substrate in a first PECVD chamber (see FIGS. 3B and 4B). In step 175, the substrate is removed from the first PECVD chamber and placed wet in a processing station where carbon-rich layer 115A is removed by spraying bottom surface 130 and bottom bevel 145 (see FIGS. 4B/4C) with a wet chemical while protecting top surface 125 and optionally top bevel 140 and edge 135 (see FIG. 4C) from the wet chemical. In one example, the wet chemical comprises dilute HF and is followed by a water rinse. In one example, the wet chemical is either Huang A or Huang B (or Huang A followed by Huang B, followed by a water rinse. A Huang A solution is an aqueous solution of ammonium hydroxide and hydrogen peroxide ($NH_4OH/H_2O_2/H_2O$). A Huang B solution is an aqueous solution of hydrochloric acid and hydrogen peroxide ($HCl/H_2O_2/H_2O$). In step 180, TEOS (or FTEOS) is deposited on the nitrogen doped silicon carbide or nitrogen doped hydrogenated silicon carbide layer in a second PECVD chamber.

Figure 10:
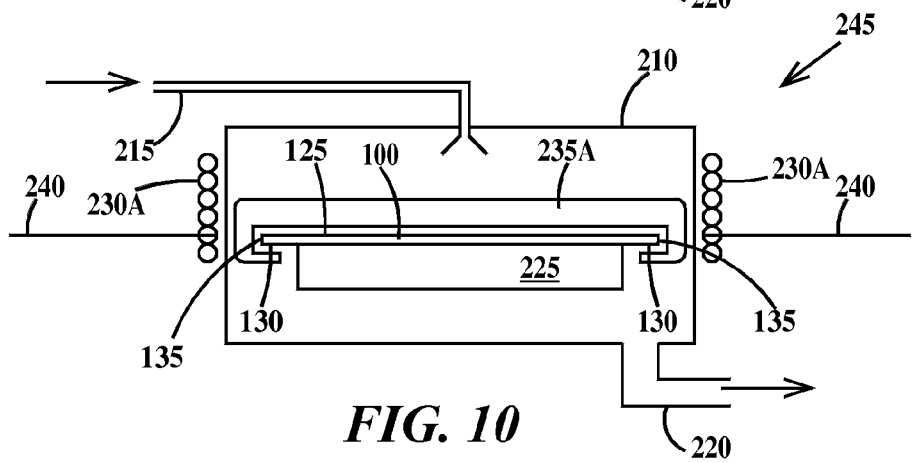
FIG. 10 is a schematic diagram of a deposition tool according to embodiments of the present invention.

FIG. 7 is a flowchart of a third method of depositing a dual-layer dielectric according to embodiments of the present invention. In step 185, nitrogen doped silicon carbide or nitrogen doped hydrogenated silicon carbide is deposited using a modified PECVD chamber as illustrated in FIG. 10 and described infra. Because the modified chamber directs plasma along bottom bevel 145 and adjacent regions of bottom surface 130 of substrate 100, a carbon-rich layer is not formed (as there is plasma present to cause the precursors to decompose/react to form nitrogen doped silicon carbide or nitrogen doped hydrogenated silicon carbide) and the region labeled 115A in FIG. 3B is deposited as nitrogen doped silicon carbide or nitrogen doped hydrogenated silicon carbide. In step 190, TEOS oxide is deposited in a standard PECVD chamber as illustrated in FIG. 9 and described infra.

FIG. 8 is a flowchart of a fourth method of depositing a dual-layer dielectric according to embodiments of the present invention. In step 195, nitrogen doped silicon carbide or nitrogen doped hydrogenated silicon carbide is deposited using a standard PECVD chamber as illustrated in FIG. 9 and described infra. Carbon-rich layer 115A is formed as illustrated in FIGS. 3B and 4B. In step 200, TEOS oxide is deposited in a modified PECVD chamber as illustrated in FIG. 10 and described infra. Because the modified chamber directs plasma along bottom bevel 145 and adjacent regions of bottom surface 130 of substrate 100 carbon-rich layer 150A removed or converted to nitrogen doped silicon carbide or nitrogen doped hydrogenated silicon carbide, as there is plasma present to cause the carbon-rich layer of nitrogen doped silicon carbide or nitrogen doped hydrogenated silicon carbide precursor derived material to volatilize or completely react to form nitrogen doped silicon carbide or nitrogen doped hydrogenated silicon carbide.

FIG. 9 is a schematic diagram of a conventional deposition tool. In FIG. 9, a PECVD tool 205 includes a chamber 210 having an inlet 215 for precursor gas, an exhaust 220, a wafer holder 225 and RF coils 230 for generating plasma 235 above top surface 125 of substrate 100. Coils 230 are located above a plane 235 defined by top surface 125 of substrate 100, so little to no plasma is formed adjacent to bottom surface 130.

FIG. 1 is a schematic diagram of a deposition tool according to embodiments of the present invention. In FIG. 10, a PECVD tool 245 includes chamber 210 having inlet 215 for precursor gas, exhaust 220, wafer holder 225 and RF coils 230 for generating plasma 235A above top surface 125 of substrate 100. Coils 230A are located above and below plane 235 defined by top surface 125 of substrate 100, so plasma is formed adjacent to bottom surface 130.

The schematic diagrams of PECVD tools 205 and 245 of FIGS. 8 and 9 are exemplary and it should be understood that the principle of forming a plasma proximate to the edge, bottom bevel surface and regions of the bottom surface adjacent to the bottom bevel surface is applicable to other configurations of PECVD tools including but not limited to parallel plate tools.

Thus the present invention provides methods and apparatus for prevention of an inter-layer dielectric adhesion problem.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) providing a circular substrate having parallel top surface and bottom surfaces, an edge, a top beveled surface between said top surface and said edge and a bottom-beveled surface between said bottom surface and said edge;
   after (a), (b) simultaneously forming using a first plasma enhanced chemical vapor deposition process (i) a first dielectric layer of nitrogen doped silicon carbide or nitrogen doped hydrogenated silicon carbide on said top surface, said top beveled surface, and said edge of said substrate and (ii) a carbon-rich layer on said bottom beveled surface that includes a material that is not nitrogen doped silicon carbide or nitrogen doped hydrogenated silicon carbide, said material derived from a precursor used to form said first dielectric layer;
   after (b), (c) treating said carbon-rich layer; and
   after (c), (d) forming a second dielectric layer of tetraethoxysilane silicon oxide or fluorinated tetraethoxysilane silicon oxide using a second plasma enhanced chemical vapor deposition process on said first dielectric layer.

2. The method of claim 1, wherein (c) includes an oxygen based plasma treatment to remove said carbon rich layer.

3. The method of claim 1, wherein (c) includes an ammonia based plasma treatment to convert said carbon rich layer to nitrogen doped silicon carbide or nitrogen doped hydrogenated silicon carbide.

4. The method of claim 1, wherein (c) includes spraying said substrate with a wet chemical to remove said carbon rich layer while protecting first dielectric layer from said wet chemical.

5. The method of claim 4, wherein said wet chemical is selected from the group consisting of dilute HF, a Huang A solution and a Huang B solution.

6. A method, comprising:
   (a) providing a circular substrate having parallel top surface and bottom surfaces, an edge, a top beveled surface between said top surface and said edge and a bottom-beveled surface between said bottom surface and said edge;
   after (a), (b) in a first plasma chamber simultaneously forming using a first plasma enhanced chemical vapor deposition process (i) a first dielectric layer of nitrogen doped silicon carbide or nitrogen doped hydrogenated silicon carbide on said top surface, said top beveled surface, and said edge of said substrate and (ii) a carbon-rich layer on said bottom beveled surface that includes a material that is not nitrogen doped silicon carbide or nitrogen doped hydrogenated silicon carbide, said material derived from a precursor used to form said first dielectric layer;
   after (b), (c) treating said carbon-rich layer; and
   (d) in a second plasma chamber, forming a second dielectric layer of tetraethoxysilane silicon oxide or fluorinated tetraethoxysilane silicon oxide using a second plasma enhanced chemical vapor deposition process on said first dielectric layer.

7. The method of claim 6, wherein (d) is performed after (c).

8. The method of claim 6, wherein (c) and (d) are performed simultaneously.

9. The method of claim 6, wherein (c) is performed in a third plasma chamber.

10. The method of claim 9, wherein said third plasma chamber generates an oxygen plasma proximate to said bottom beveled edge to remove said carbon rich layer.

11. The method of claim 6, wherein said second plasma chamber generates an ammonia plasma proximate to said bottom beveled edge to convert said carbon rich layer to nitrogen doped silicon carbide or nitrogen doped hydrogenated silicon carbide.

12. The method of claim 6, wherein said first chamber does not generate a plasma proximate to said bottom beveled edge.

* * * * *